United States Patent
Chen et al.

(10) Patent No.: US 11,508,675 B2
(45) Date of Patent: Nov. 22, 2022

(54) SEMICONDUCTOR PACKAGE STRUCTURE HAVING ANTENNA MODULE

(71) Applicant: SJ Semiconductor (Jiangyin) Corporation, Jiangyin (CN)

(72) Inventors: Yenheng Chen, Jiangyin (CN); Chentar Wu, Jiangyin (CN); Chengchung Lin, Jiangyin (CN)

(73) Assignee: SJ SEMICONDUCTOR (JIANGYIN) CORPORATION, Jiangyin (CN)

( * ) Notice: Subject to any disclaimer, the term of this patent is extended or adjusted under 35 U.S.C. 154(b) by 466 days.

(21) Appl. No.: 16/233,000

(22) Filed: Dec. 26, 2018

(65) Prior Publication Data

US 2019/0198466 A1 Jun. 27, 2019

(30) Foreign Application Priority Data

Dec. 27, 2017 (CN) .......................... 201721855105.0

(51) Int. Cl.
| | |
|---|---|
| *H01L 23/66* | (2006.01) |
| *H01L 23/31* | (2006.01) |
| *H01L 23/498* | (2006.01) |
| *H01L 23/00* | (2006.01) |
| *H01L 23/373* | (2006.01) |
| *H01Q 1/38* | (2006.01) |
| *H01Q 21/06* | (2006.01) |
| *H01Q 1/22* | (2006.01) |

(52) U.S. Cl.
CPC .......... *H01L 23/66* (2013.01); *H01L 23/3128* (2013.01); *H01L 23/3731* (2013.01); *H01L 23/49816* (2013.01); *H01L 23/49838* (2013.01); *H01L 23/49866* (2013.01); *H01L 24/32* (2013.01); *H01Q 1/2283* (2013.01); *H01Q 1/38* (2013.01); *H01Q 21/061* (2013.01); *H01Q 21/065* (2013.01); *H01L 24/29* (2013.01); *H01L 2223/6677* (2013.01); *H01L 2224/04105* (2013.01); *H01L 2224/12105* (2013.01); *H01L 2224/29083* (2013.01); *H01L 2224/32225* (2013.01); *H01L 2224/73267* (2013.01); *H01L 2224/92244* (2013.01); *H01L 2224/97* (2013.01); *H01L 2924/3511* (2013.01)

(58) Field of Classification Search
CPC ... H01Q 1/2283; H01L 23/6677; H01L 23/66; H01L 2223/6677
See application file for complete search history.

(56) References Cited

U.S. PATENT DOCUMENTS

| | | | | |
|---|---|---|---|---|
| 2014/0097990 | A1* | 4/2014 | Aboush | H01Q 21/065 343/700 MS |
| 2017/0346185 | A1* | 11/2017 | Wang | H01Q 1/2283 |
| 2018/0366347 | A1* | 12/2018 | Chuang | H01L 21/561 |
| 2019/0181104 | A1* | 6/2019 | Chen | H01Q 21/065 |

\* cited by examiner

Primary Examiner — Robert Karacsony
(74) Attorney, Agent, or Firm — Alston & Bird LLP

(57) ABSTRACT

A semiconductor package structure having an antenna module includes: a substrate, having a first surface and a second surface; a semiconductor chip, disposed on the first surface; a plastic packaging material layer, formed on the first surface, where the plastic packaging material layer wraps the semiconductor chip and exposes a part of a front surface of the semiconductor chip; a rewiring layer, disposed on the plastic packaging material layer and electrically connected to the semiconductor chip; a metal bump, electrically connected to the rewiring layer; and an antenna module, disposed on the second surface of the substrate.

10 Claims, 4 Drawing Sheets

SEMICONDUCTOR PACKAGE STRUCTURE HAVING ANTENNA MODULE

CROSS REFERENCES TO RELATED APPLICATIONS

This application claims the benefit of priority to Chinese Patent Application No. CN2017218551050, entitled "Semiconductor Packaging Structure Having Antenna Module", filed with SIPO on Dec. 27, 2017, the contents of which are incorporated herein by reference in its entirety.

TECHNICAL FIELD

The present disclosure relates to the field of semiconductor packaging, and in particular, to a semiconductor package structure having an antenna module.

BACKGROUND

With increased functions, performance, integration level of integrated circuits, and the emergence of new integrated circuits, packaging technology has played an increasingly important role in integrated circuit products, and has amounted to a higher proportion in the value of the entire electronic systems. At the same time, with the critical size of integrated circuits reaching a nanometer level, transistors are developing towards higher density and higher clock frequencies, therefore packaging sizes are shrinking as the result.

Fan-out wafer level packaging (FOWLP) technology has the advantages of miniaturization, low cost and high integration level, as well as better performance and higher energy efficiency. It has become an important packaging method for electronic devices such as in high-requirement mobile/wireless networks, and it is one of the most promising packaging technologies at present. In addition, for the consideration of communication effect, radio frequency chips are always provided with antennas in use. However, most of the existing radio frequency antennas are laid out directly on the PCB during layout design for radio frequency function modules or interfaces for external antennas are reserved during layout design. In order to ensure the antenna gain, this method must be at the expense of the PCB area. In addition, it is difficult to control the warpage of fan-out wafer level packaging by adopting processes such as plastic packaging, when the warpage is difficult to be alleviated, material shrinkage or swelling causing slippage and misalignment in the packaging process is also difficult to control. And the heat conductivity is poor leading to overheating problems. In addition, preparation process and selection of components caused weak bonding strength between components which may shift.

Therefore, it is necessary to provide a solution for semiconductor packaging structure having antennas to reduce warpage, and overheating at a low-cost.

SUMMARY

The present disclosure provides a semiconductor package structure having an antenna module. The semiconductor package structure comprises: a substrate, having a first surface and a second surface opposite to the first surface; a semiconductor chip having a front and a back surfaces, disposed with the back surface contacting the first surface of the substrate; a plastic packaging material layer, formed on the first surface of the substrate, where the plastic packaging material layer embeds the semiconductor chip except leaving a part of the front surface of the semiconductor chip exposed; a rewiring layer, disposed on the plastic packaging material layer, where the exposed part of the semiconductor chip is electrically connected to the rewiring layer; a metal bump, electrically connected to the rewiring layer; and an antenna module, disposed on the second surface of the substrate.

As a preferred embodiment of the present disclosure, a layer of adhesive film is formed between the back surface of the first semiconductor chip and the substrate.

As a preferred embodiment of the present disclosure, the substrate comprises a quartz glass substrate or a sapphire substrate.

As a preferred embodiment of the present disclosure, the rewiring layer comprises: a dielectric layer, bonded onto the first surface of the substrate; one metal wire layer, where the metal wire layer is patterned inside the dielectric layer; and an under-bump metal layer, patterned in the dielectric layer, and electrically connected to the metal wire layer, where the metal bump is disposed on the under-bump metal layer.

As a preferred embodiment of the present disclosure, the metal bump comprises: a copper column, a nickel layer disposed on a top surface of the copper column and a solder bump disposed on the nickel layer.

As a preferred embodiment of the present disclosure, the antenna module comprises a plurality of antenna units, each having a same contour, and a spacing space is arranged between adjacent each other of the plurality of antenna units.

As a preferred embodiment of the present disclosure, the plurality of antenna units is arranged on the second surface of the substrate in an array, or arranged along ring, or in an unevenly spaced pattern.

As a preferred embodiment of the present disclosure, the plurality of antenna units each has a hexagonal shape and the antenna module is arranged like a honeycomb on the second surface of the substrate, and a gap is arranged between any two near-by units of the plurality of antenna units.

As a preferred embodiment of the present disclosure, a foot print of the plurality of antenna units each is a hexagon on the surface of the substrate.

As a preferred embodiment of the present disclosure, the antenna module comprises at least two layers of antenna module units, and each layer of the antenna module unit comprises at least one antenna unit.

DESCRIPTIONS OF REFERENCE NUMERALS

Figure 1:
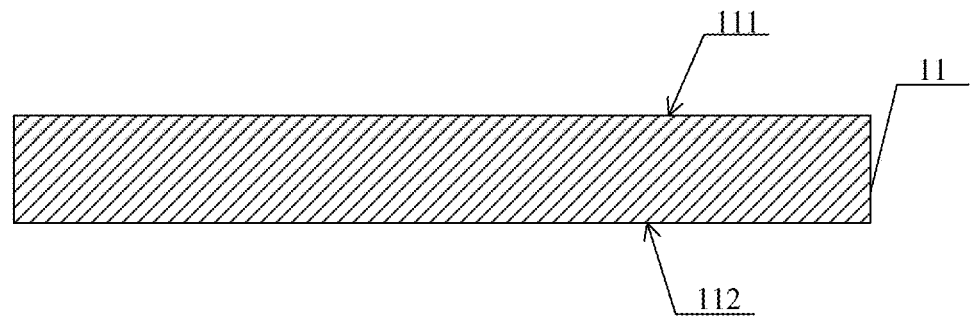
FIG. 1 is a substrate of a semiconductor package structure according to the present disclosure.

11 Substrate
111 First surface
112 Second surface
21 Semiconductor chip
211 Metal welding pad
31 Adhesive film
41 Plastic packaging material layer
51 Rewiring layer
511 Under-bump metal layer
512 Dielectric layer
513 Metal wire layer
61 Antenna module
611 Antenna unit
71 Metal bump
81 Bonding layer
91 Fixing ring

DETAILED DESCRIPTION OF THE PREFERRED EMBODIMENTS

Implementations of the present disclosure are described below by using particular and specific embodiments, and a person skilled in the art can easily understand other advantages and efficacy of the present disclosure from content disclosed in the specification.

Referring to FIG. 1 to FIG. 10, it should be known that, structures, proportions, sizes and the like drawn in drawings appended to this specification are all only used to be understood and read by a person skilled in the art in cooperation with content disclosed in the specification, but are not used to limit limitation conditions that the present disclosure may implement, and therefore do not have a technically essential meaning. Any modification in a structure, change in a proportion relationship or adjustment in a size, without affecting the efficacy that the present disclosure can generate and the object that the present disclosure can achieve, should still fall within the scope that the technical content disclosed in the present disclosure can cover. Moreover, terms such as "upper", "lower", "left", "right", "middle" and "a" cited in this specification are also only used to facilitate clear description, but are not used to limit the scope that the present disclosure may implement, and change or adjustment in a relative relationship between the terms, without essentially changing the technical content, should also be considered as the scope that the present disclosure may implement.

As shown in FIG. 1 to FIG. 10, the present disclosure provides a semiconductor package structure having an antenna module. The semiconductor package structure comprises:

a substrate 11, having a first surface 111 and a second surface 112 opposite to the first surface;

a semiconductor chip 21, disposed on the first surface 111 of the substrate 11, wherein a back surface of the semiconductor chip 21 is in contact with the substrate 11;

a plastic packaging material layer 41, formed on the first surface 111 of the substrate 11, wherein the plastic packaging material layer 41 wraps the semiconductor chip 21 and exposes a part of a front surface of the semiconductor chip 21;

a rewiring layer 51, disposed on the plastic packaging material layer 41, wherein the semiconductor chip is electrically connected to the semiconductor chip 21 based on the exposed part;

a plurality of metal bumps 71, electrically connected to the rewiring layer 51; and an antenna module 61, disposed on the second surface 112 of the substrate 11.

In an example, the substrate 11 may be a quartz glass substrate or a sapphire substrate.

Specifically, the present disclosure provides a semiconductor package structure, wherein the substrate 11 is preferably a quartz substrate or a sapphire substrate. On the one hand, because the quartz plate has no warpage problem, the semiconductor chip can be prevented from being broken, warped and cracked in the subsequent preparation process; and on the other hand, quartz has good heat conductivity, which is ten to hundred times better than that of packaging material, thus the problem of heat effect in the packaging process will be solved. In addition, in other examples, the substrate may also be any other glass substrates, which is not specifically limited herein.

The shape of the substrate 11 may be set according to actual needs. The shape of the substrate 11 may be a rectangle, a circle, a hexagon, a triangle, a trapezoid or the like, which is not limited herein.

Specifically, the semiconductor chip 21 may be any kind of semiconductor function chip, and a connection metal welding pad 211 electrically leading out its internal function devices is further formed on the front surface of the semiconductor chip 21. It should be noted that, the "back surface" is another surface of a chip (for example, the first semiconductor chip 21) opposite to the metal welding pad 211 on the chip, and a surface having the metal welding pad 211 is defined as the front surface. A top surface of the metal welding pad 211 is exposed from a top surface of the semiconductor chip 21, and the top surface of the metal welding pad 211 may be leveled with the top surface of the semiconductor chip 21, or may protrude from the top surface of the semiconductor chip 21.

In addition, in the present disclosure, structures such as the antenna module, the rewiring layer, the metal bump and the semiconductor chip are disposed on each side of the two opposite side of the substrate, and the semiconductor chip is disposed between the rewiring layer and the substrate. Therefore, an antenna structure can be properly designed, and the volume of the entire semiconductor package structure can be reduced.

In an example, a layer of adhesive film 31 is formed between the back surface of the first semiconductor chip 21 and the substrate 11.

Specifically, the adhesive film 31 may be a die-attach film (DAF) or a backside lamination (BSL) film. Preferably, the adhesive film 31 is a laminated structure comprising a first adhesive layer, a high heat conduction resin layer and a second adhesive layer, wherein the first adhesive layer, the high heat conduction resin layer and the second adhesive layer are sequentially stacked. Because the adhesive film 31 is disposed between the first semiconductor chip 21 and the substrate 11 (a peeling layer or a buffer layer that may be further formed), an adhesion force between the first semiconductor chip 21 and the substrate 11 (or the peeling layer or the buffer layer) may be enhanced. In a process such as a transfer process or a sawing process, the first semiconductor chip 21 will not wobble, thereby ensuring the stability of the structure.

In an example, the rewiring layer 51 includes: a dielectric layer 512, bonded onto the first surface 111 of the substrate 11; one metal wire layer 513, disposed inside the dielectric layer 512; and an under-bump metal layer 511, disposed on the dielectric layer 512, and extending into the dielectric layer 512 to be electrically connected to the metal wire layer 513, wherein the metal bump 71 is disposed on the under-bump metal layer 511.

Specifically, in an example, the rewiring layer 51 comprises a metal wire layer 513, a dielectric layer 512 and an under-bump metal layer 511. In an example, a process for manufacturing the under-bump metal layer comprises: first forming a metal wire layer on a surface of the substrate, and then forming a dielectric layer on the surface, where the dielectric layer wraps the metal wire layer. Alternatively, a dielectric layer is first formed, and then processes such as etching and filling are performed; after that forming an opening in the dielectric layer, thereby preparing the under-bump metal layer. Certainly, the rewiring layer may be any rewiring layer structure frequently used in the art, or any rewiring layer that may implement an electrical connection leading-out function may be prepared by using another process.

Additionally, in another example, the dielectric layer may have two or more layers and the metal wire layer may have two or more layers as well. For example, a first insulation layer is formed on a surface of the substrate; the metal wire layer is formed on the first insulation layer; a second insulation layer is formed on a top surface of the first insulation layer, and the second insulation layer covers the metal wire layer; an opening is formed in the second insulation layer, and the metal wire layer is exposed from the opening; and the under-bump metal layer is formed in the opening.

Specifically, a material of the metal wire layer 513 may be, but is not limited to, one of copper, aluminum, nickel, only, silver and titanium, or a laminated material layer having two of these materials. A material of the dielectric layer 512 may be a low-k dielectric material, and may comprise one of an epoxy resin, a silica gel, PI (polyimide), PBO (Polybenzoxazole), BCB (Benzocyclobutene), a silicon oxide, phosphosilicate glass and fluorine-containing glass.

In an example, the metal bump 71 comprises: a copper column, a nickel layer disposed on a top surface of the copper column and a solder bump disposed on the nickel layer.

Specifically, the metal bump 71 may be a metal column, a solder ball, a combination of a copper column and solder metal, or the like. In this embodiment, a metal bump 71 is provided, and preparation of the metal bump comprises manufacturing an under-bump metal layer on the rewiring layer; forming a copper column on a surface of the under-bump metal layer; forming a metal blocking layer on a surface of the copper column; and forming solder metal on a surface of the metal blocking layer, and forming a solder bump on the surface of the metal blocking layer by using a high-temperature reflow process.

The metal blocking layer comprises a nickel layer, and a material of the solder bump comprises one of lead, tin and silver, or an alloy of the foregoing solder metal.

In an example, the antenna module 61 comprises a plurality of antenna units 611, the antenna units 611 have a same contour, and a spacing is arranged between adjacent antenna units.

Specifically, the antenna module 61 comprises at least one antenna unit 611, and the shape of the antenna unit may be block-shaped or spiral. Certainly, there may be a plurality of antenna units 611, such as 10 to 100, depending on an actual requirement. When the number of the antenna units is more than two, shapes of the different antenna units 611 may be the same or different. In addition, when the antenna unit 611 is a block-shaped antenna, the block-shaped antenna may be a metal block; and when the antenna unit 611 is a spiral antenna, the spiral antenna may be formed by winding a metal wire into a spiral shape. Preferably, antenna units have the same outer contour, such that uniform control can be realized which will facilitates reasonable layout according to actual requirement.

Additionally, a material of the antenna unit can be, but is not limited to, any of copper, aluminum, nickel, gold, silver, tin and titanium, or a laminated material layer consisting of two or more of the above-mentioned material layers, which may be prepared by using any one of techniques like physical vapor deposition process (PVD), chemical vapor deposition process (CVD), sputtering, electroplating and chemical plating.

In an example, the antenna units 611 are arranged on the second surface 112 of the substrate 11 in an array, in a ring shape or irregularly spacing arranged.

In an example, the antenna units 611 are arranged in a hexagonal honeycomb shape on the second surface 112 of the substrate 11, and a gap is arranged between the antenna units 611.

In an example, the shape of a cross section of the antenna unit 611 along a direction of a surface of the substrate 11 comprises a regular hexagon.

Figure 9:
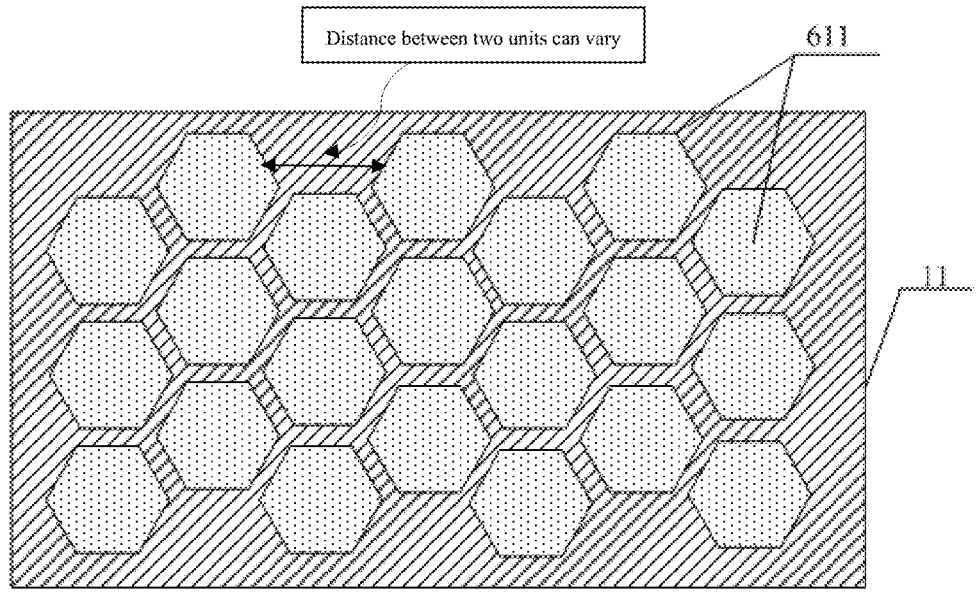
FIG. 9 is a top view of the antenna module in FIG. 8.

Specifically, a layout manner of the antenna units 611 is provided in this example. As shown in FIG. 9, the antenna units are evenly arranged, and arranged in a hexagonal honeycomb shape, and a gap is arranged between the antenna units 611. The process for this design method is simple, the antenna units with the same outer contour do not need any other additional processes, it is suitable for mass production, the antenna signal is uniform and the loss is small. In addition, the gap between adjacent antenna units is arranged according to actual conditions. For example, in the plane where the surface of the substrate is disposed, the distance between the centers of adjacent antenna units may be arbitrarily set along the longitudinal direction or the horizontal direction perpendicular thereto, and the size of each antenna unit may be arbitrarily selected. Certainly, an arrangement manner of the antenna units may be configured according to requirement, antenna units having a large density may be configured at required locations, or the antenna units may be arranged irregularly, which is not limited herein.

In an example, the antenna module 61 comprises at least two layers of antenna module unit, and each layer of the antenna module unit comprises at least one antenna unit 611.

Specifically, the antenna module 61 may be formed by a plurality of antenna units 611 arranged in a single layer on the second surface 112 of the substrate 11, or, arranged in a plurality of layers, which comprises two or more antenna unit layers, and then, design of antenna units in a reasonable number and shape is performed on each antenna unit layer, wherein adjacent two antenna unit layers are separated by the bonding layer 81, and the electric connection between the different layers is realized by a conductive plug-formed in the dielectric layer, such that flexible antenna layout design can be performed according to the specific needs.

Figure 2:
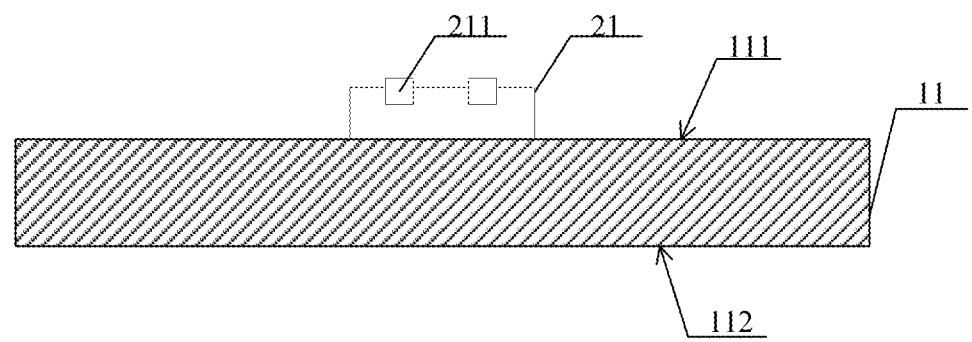
FIG. 2 is a cross sectional view after a semiconductor chip is formed during preparation of a semiconductor package structure according to the present disclosure.
Figure 3:
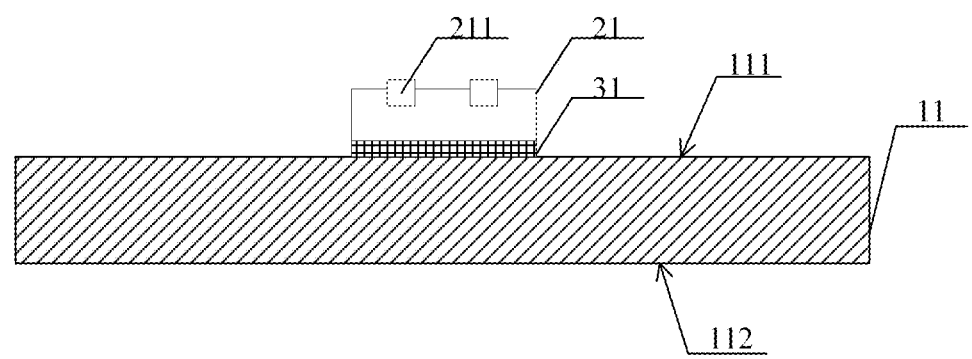
FIG. 3 is a cross sectional view after an adhesive film is formed during preparation of a semiconductor package structure according to the present disclosure.
Figure 4:
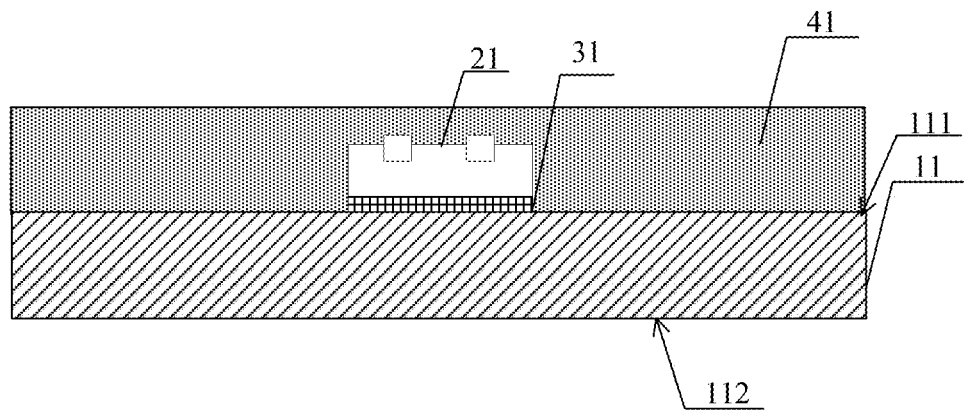
FIG. 4 is a cross section view after a plastic packaging material layer is formed during preparation of a semiconductor package structure according to the present disclosure.
Figure 5:
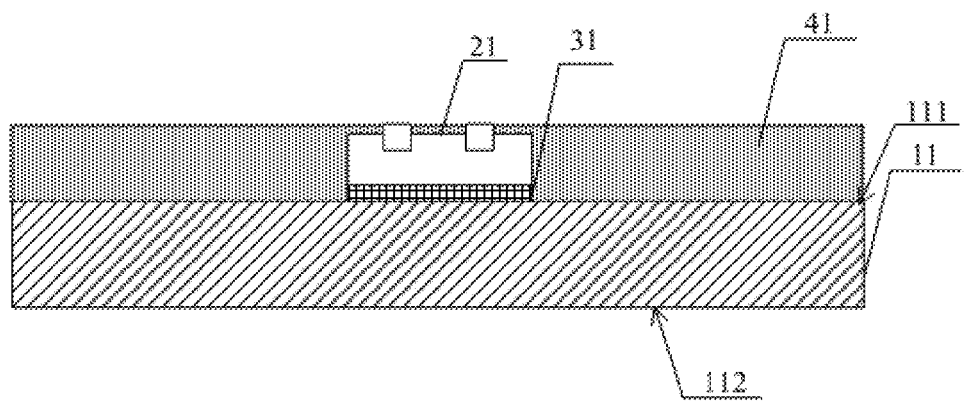
FIG. 5 is a cross sectional view after a plastic packaging material layer is planarized during preparation of a semiconductor package structure according to the present disclosure.
Figure 6:
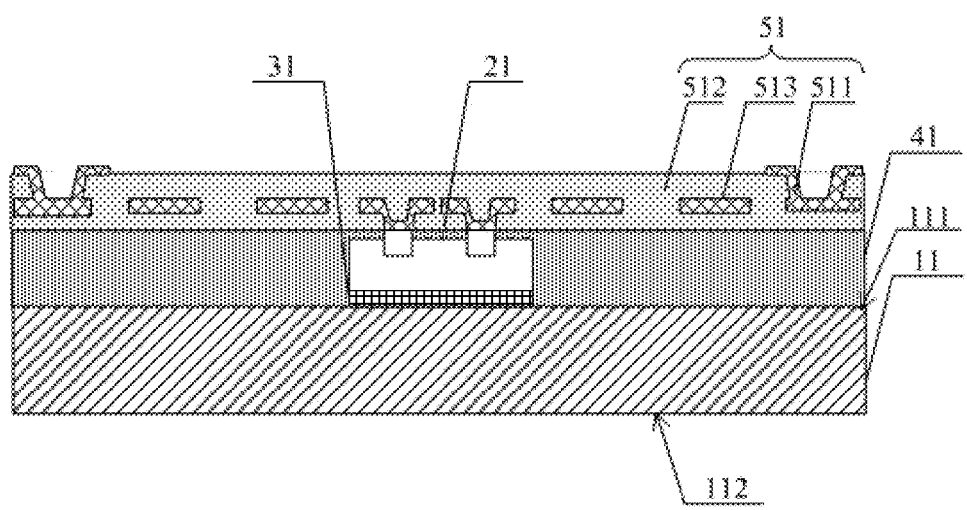
FIG. 6 is a cross sectional view after a rewiring layer is formed during preparation of a semiconductor package structure according to the present disclosure.
Figure 7:
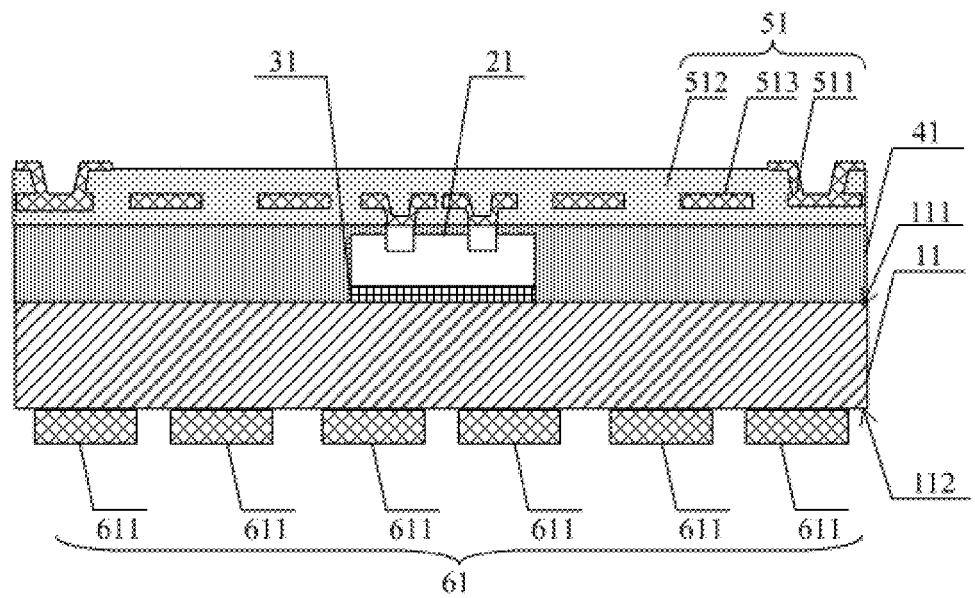
FIG. 7 is a cross sectional view after an antenna module is formed during preparation of a semiconductor package structure according to the present disclosure.
Figure 8:
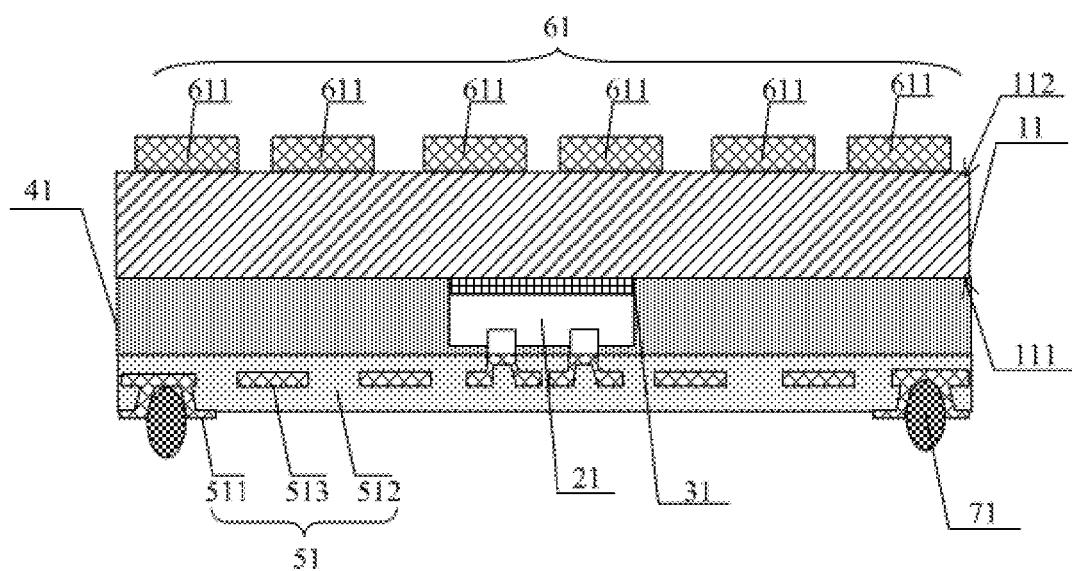
FIG. 8 is a cross sectional view after a metal bump is formed during preparation of a semiconductor package structure according to the present disclosure.
Figure 10:
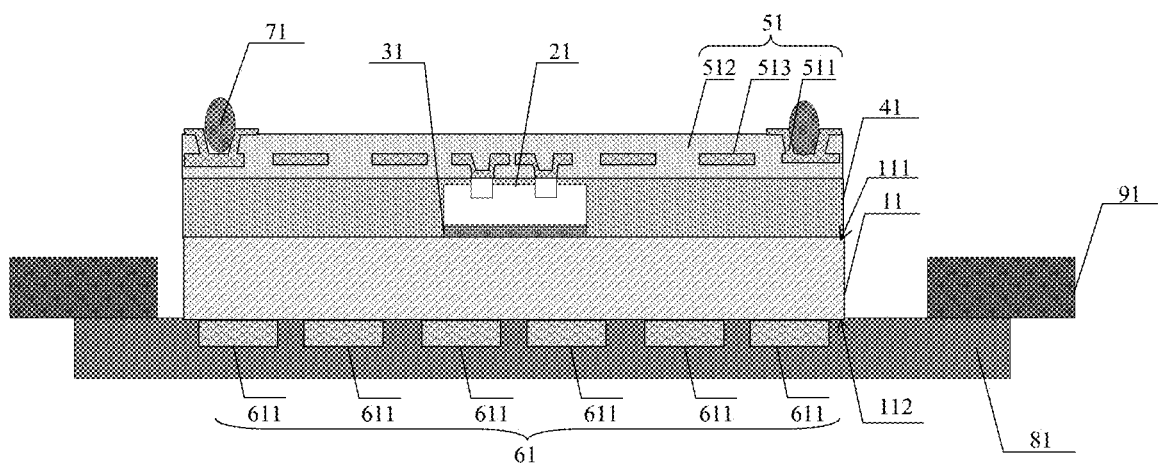
FIG. 10 is a cross sectional view of the finished semiconductor package structure according to the present disclosure.

Additionally, it should be further noted that, this application further provides a method for preparing the foregoing semiconductor package structure having an antenna module. As shown in FIG. 1, a substrate 11 is provided. Then, a process (die bonder) of bonding a semiconductor chip 21 shown in FIG. 2 is performed, which comprises a step of first forming an adhesive film and then forming a semiconductor chip, as shown in FIG. 3; then, as shown in FIG. 4 and FIG. 5, a plastic packaging material layer (molding) is formed, which comprises a step of planarizing the plastic packaging material layer to expose a metal welding pad shown in FIG. 5; then, FIG. 6 shows a structure after a rewiring layer 21 (top side RDL) is prepared; as shown in FIG. 7 and FIG. 9, then an antenna module 61 (antenna layer) is prepared; then, as shown in FIG. 8, a metal bump 71 (ball mount) is prepared; certainly, as shown in FIG. 10, the method further comprises a step of performing wafer sawing (wafer mount & dicing saw or laser saw), where in a sawing process, a bonding layer 81 and a fixing ring 91 are further comprised, thereby obtaining the semiconductor package structure of the present disclosure.

To sum up, the semiconductor package structure having an antenna module in the present disclosure comprises: a substrate, having a first surface and a second surface opposite to the first surface; a semiconductor chip, disposed on the first surface of the substrate, where a back surface of the semiconductor chip is in contact with the substrate; a plastic packaging material layer, formed on the first surface of the substrate, where the plastic packaging material layer wraps the semiconductor chip and exposes a part of a front surface of the semiconductor chip; a rewiring layer, disposed on the plastic packaging material layer, where based on the exposed part, the semiconductor chip is electrically connected to the semiconductor chip; a plurality of metal bump, electrically connected to the rewiring layer; and an antenna module, disposed on the second surface of the substrate. By using the foregoing solution, in the present disclosure, the antenna module and the rewiring layer are disposed on two opposite surfaces of the substrate, and the semiconductor chip is disposed between the rewiring layer and the substrate, so as to facilitate proper packaging layout design; and the plastic packaging material layer and the rewiring layer wrap the semiconductor chip, so as to facilitate improvement in the stability of the package structure. In the present disclosure, quartz glass or the like is selected as the substrate, the heat conductivity of quartz is ($\sim$3-6 W m$^{-1}$ K$^{-1}$), so about ten times better than that of the packaging material ($\sim$0.3-0.5 W m$^{-1}$ K$^{-1}$), therefore the problem of heat effect is solved. Moreover, since quartz sheet has very little warping problem, the chip is further prevented from being easily warped and broken in the subsequent process, the manufacturing is facilitated, and the yield is improved. The structure of the present disclosure is simple and convenient, has low costs, and is suitable for mass production. Therefore, the present disclosure effectively overcomes various disadvantages in the prior art and has a high industrial utilization value.

The foregoing embodiments are merely intended to exemplarily describe the principles and efficacy of the present disclosure and are not intended to limit the present disclosure. A person skilled in the art can make modifications or changes to the foregoing embodiments without departing from the spirit and scope of the present disclosure. Therefore, any equivalent modifications or changes completed by a person of common knowledge in the art without departing from the spirit and technical thoughts disclosed in the present disclosure shall still fall within the scope of the claims of the present disclosure.

The invention claimed is:

1. A semiconductor package structure having an antenna module, comprising:
    a substrate, having a first surface and a second surface opposite to the first surface;
    a semiconductor chip having a front and a back surface, disposed with the back surface contacting the first surface of the substrate;
    a plastic packaging material layer, formed on the first surface of the substrate, wherein the plastic packaging material layer embeds the semiconductor chip except leaving a part of the front surface of the semiconductor chip exposed;
    a rewiring layer, disposed on the plastic packaging material layer, wherein the exposed part of the semiconductor chip is electrically connected to the rewiring layer; and
    a metal bump, electrically connected to the rewiring layer;
    wherein the antenna module is disposed on the second surface of the substrate, wherein the antenna module comprises at least two antenna unit layers in a bonding layer, wherein the at least two antenna unit layers are electrically connected, and wherein the electric connection between the two antenna unit layers comprises a conductive plug through the bonding layer.

2. The semiconductor package structure having an antenna module according to claim 1, wherein a layer of adhesive film is formed between the back surface of the semiconductor chip and the substrate.

3. The semiconductor package structure having an antenna module according to claim 1, wherein the substrate is a quartz glass substrate or a sapphire substrate.

4. The semiconductor package structure having an antenna module according to claim 1, wherein the rewiring layer comprises:
    a first dielectric layer, bonded onto the front surface of the substrate;
    one metal wire layer, wherein the metal wire layer is patterned inside the first dielectric layer; and
    an under-bump metal layer, patterned in the first dielectric layer, and electrically connected to the metal wire layer, wherein the metal bump is disposed on the under-bump metal layer.

5. The semiconductor package structure having an antenna module according to claim 1, wherein the metal bump comprises: a copper column, a nickel layer disposed on a top surface of the copper column and a solder bump disposed on the nickel layer.

6. The semiconductor package structure having an antenna module according to claim 1 wherein the antenna module in each of the at least two antenna unit layers comprises a plurality of antenna units, each having a same contour, and a space is arranged between two adjacent ones of the plurality of antenna units.

7. The semiconductor package structure having an antenna module according to claim 6, wherein the plurality of antenna units is arranged in an array on the second surface of the substrate.

8. The semiconductor package structure having an antenna module according to claim 6, wherein the plurality of antenna units each has a hexagonal shape and the antenna module is arranged like a honeycomb on the second surface of the substrate, and wherein a gap is arranged between any two adjacent units of the plurality of antenna units.

9. The semiconductor package structure having an antenna module according to claim 8, wherein a foot print of the plurality of antenna units each is a hexagon on the second surface of the substrate.

10. The semiconductor package structure having an antenna module according to claim 1, wherein each layer of the antenna module units comprises at least one antenna unit.

\* \* \* \* \*